(12) United States Patent
Fukuda et al.

(10) Patent No.: US 10,263,159 B2
(45) Date of Patent: Apr. 16, 2019

(54) LIGHT-EMITTER MOUNTING PACKAGE, LIGHT-EMITTING DEVICE, AND LIGHT-EMITTING MODULE

(71) Applicant: KYOCERA Corporation, Kyoto-shi, Kyoto (JP)

(72) Inventors: Kenjirou Fukuda, Kyoto (JP); Kensaku Murakami, San Diego, CA (US); Kouichi Kawasaki, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/551,961

(22) PCT Filed: Feb. 23, 2016

(86) PCT No.: PCT/JP2016/055248
§ 371 (c)(1),
(2) Date: Aug. 18, 2017

(87) PCT Pub. No.: WO2016/136733
PCT Pub. Date: Sep. 1, 2016

(65) Prior Publication Data
US 2018/0040773 A1   Feb. 8, 2018

(30) Foreign Application Priority Data

Feb. 25, 2015   (JP) .................................. 2015-035429

(51) Int. Cl.
*H01L 33/60*      (2010.01)
*H01L 33/46*      (2010.01)
(Continued)

(52) U.S. Cl.
CPC ............ *H01L 33/46* (2013.01); *H01L 33/486* (2013.01); *H01L 33/54* (2013.01); *H01L 33/60* (2013.01);
(Continued)

(58) Field of Classification Search
CPC ....... H01L 33/46; H01L 33/486; H01L 33/54; H01L 33/62; H01L 33/48; H01L 33/483; H01L 33/60
See application file for complete search history.

(56) References Cited

U.S. PATENT DOCUMENTS 7,648,775 B2 *   1/2010   Wakako ................. H01L 33/60
                                                         428/220
7,928,462 B2 *   4/2011   Jang ...................... H01L 25/167
                                                         257/99
(Continued)

FOREIGN PATENT DOCUMENTS

JP   2007-324150 A   12/2007
JP   2008-160032 A    7/2008
(Continued)

OTHER PUBLICATIONS

International Search Report, PCT/JP2016/055248, dated Apr. 12, 2016, 2 pgs.

*Primary Examiner* — Jose R Diaz
(74) *Attorney, Agent, or Firm* — Volpe and Koenig, P.C.

(57) ABSTRACT

A light-emitter mounting package includes an insulating base, a wiring conductor, and a metal layer. The insulating base has a main surface including a recess in which a light emitter is mountable. The wiring conductor is arranged on a peripheral portion of a bottom surface of the recess that is adjacent to an inner wall of the recess. The insulating base has a side surface including a sloping surface adjacent to the main surface. The metal layer is spaced from the wiring conductor, and extends on the inner wall of the recess, the main surface, and the sloping surface.

10 Claims, 11 Drawing Sheets

(51) Int. Cl.
*H01L 33/48* (2010.01)
*H01L 33/54* (2010.01)
*H01L 33/62* (2010.01)
*H01L 33/64* (2010.01)

(52) U.S. Cl.
CPC ............ *H01L 33/62* (2013.01); *H01L 33/641* (2013.01); *H01L 2224/16225* (2013.01); *H01L 2224/48091* (2013.01); *H01L 2224/48227* (2013.01); *H01L 2924/181* (2013.01); *H01L 2933/0058* (2013.01)

(56) References Cited

U.S. PATENT DOCUMENTS

| | | | | |
|---|---|---|---|---|
| 8,071,987 | B2* | 12/2011 | Bogner | ............... H01L 31/0203 257/81 |
| 2006/0198162 | A1* | 9/2006 | Ishidu | ..................... H01L 33/60 362/623 |
| 2010/0025722 | A1 | 2/2010 | Wada | |
| 2011/0033962 | A1* | 2/2011 | Kwon | ..................... H01L 33/46 438/29 |
| 2014/0361321 | A1* | 12/2014 | Saito | ..................... H01L 33/005 257/89 |
| 2017/0309793 | A1* | 10/2017 | Seo | ........................ H01L 33/38 |
| 2018/0040773 | A1* | 2/2018 | Fukuda | ................... H01L 33/46 |
| 2018/0040779 | A1* | 2/2018 | Baek | ..................... H01L 33/486 |
| 2018/0083172 | A1* | 3/2018 | Matsui | ..................... H01L 33/22 |

FOREIGN PATENT DOCUMENTS

| | | |
|---|---|---|
| JP | 2009-239017 A | 10/2009 |
| JP | 2011-009401 A | 1/2011 |
| JP | 2014-072282 A | 4/2014 |
| WO | 2012/086724 A1 | 6/2012 |

\* cited by examiner

LIGHT-EMITTER MOUNTING PACKAGE, LIGHT-EMITTING DEVICE, AND LIGHT-EMITTING MODULE

FIELD

The present invention relates to a light-emitter mounting package in which a light emitter such as a light-emitting diode is mounted, a light-emitting device, and a light-emitting module.

BACKGROUND

A known light-emitter mounting package has a recess in which a light emitter is to be mounted (refer to Japanese Unexamined Patent Application Publication No. 2009-239017).

BRIEF SUMMARY

Technical Problem

As recent light-emitting devices tend to be smaller and have higher luminance, light-emitter mounting packages are increasingly smaller. A smaller light-emitter mounting package with a recess can have leakage of a large amount of light passing through the wall of the recess.

Solution to Problem

A light-emitter mounting package according to one aspect of the present invention includes an insulating base having a main surface including a recess in which a light emitter is mountable, and a side surface including a sloping surface adjacent to the main surface, and a wiring conductor arranged on a peripheral portion of a bottom surface of the recess. The peripheral portion is adjacent to an inner wall of the recess. The light-emitter mounting package includes a metal layer that is spaced from the wiring conductor and extends on the inner wall of the recess, the main surface, and the sloping surface.

A light-emitting device according to another aspect of the present invention includes the light-emitter mounting package according to the above aspect, and the light emitter mounted in the recess of the light-emitter mounting package.

A light-emitting module according to another aspect of the present invention includes the light-emitting device according to the above aspect, and a module substrate including a connection pad to which the light-emitting device is connected with a bonding member.

Advantageous Effects

The light-emitter mounting package according to the above aspect of the present invention includes the insulating base including the main surface having the recess in which a light emitter is mountable and the side surface including the sloping surface adjacent to the main surface, and the wiring conductor arranged on the peripheral portion of the bottom surface of the recess that is adjacent to the inner wall of the recess. The metal layer is spaced from the wiring conductor extends from the inner wall of the recess to the main surface and the sloping surface. The metal layer effectively reduces light passing through the wall of the recess and leaking outside.

The light-emitting device according to the above other aspect of the present invention includes the light-emitter mounting package according to the above aspect, and the light emitter mounted in the recess of the light-emitter mounting package. The light-emitting device can effectively emit light outside.

The light-emitting module according to the above other aspect of the present invention includes the light-emitting device according to the above aspect, and the module substrate including the connection pad to which the light-emitting device is connected with the bonding member. The light-emitting module can effectively emit light outside.

DETAILED DESCRIPTION

Embodiments of the present invention will be described by way of example with reference to the accompanying drawings.

First Embodiment

As shown in FIGS. 1A to 2B, a light-emitting device according to a first embodiment of the present invention includes a light-emitter mounting package 1, and a light emitter 2 mounted in a recess 12 in the light-emitter mounting package 1. The light-emitting device is mounted on, for example, a module substrate 5 included in a light-emitting module.

Figure 1A:
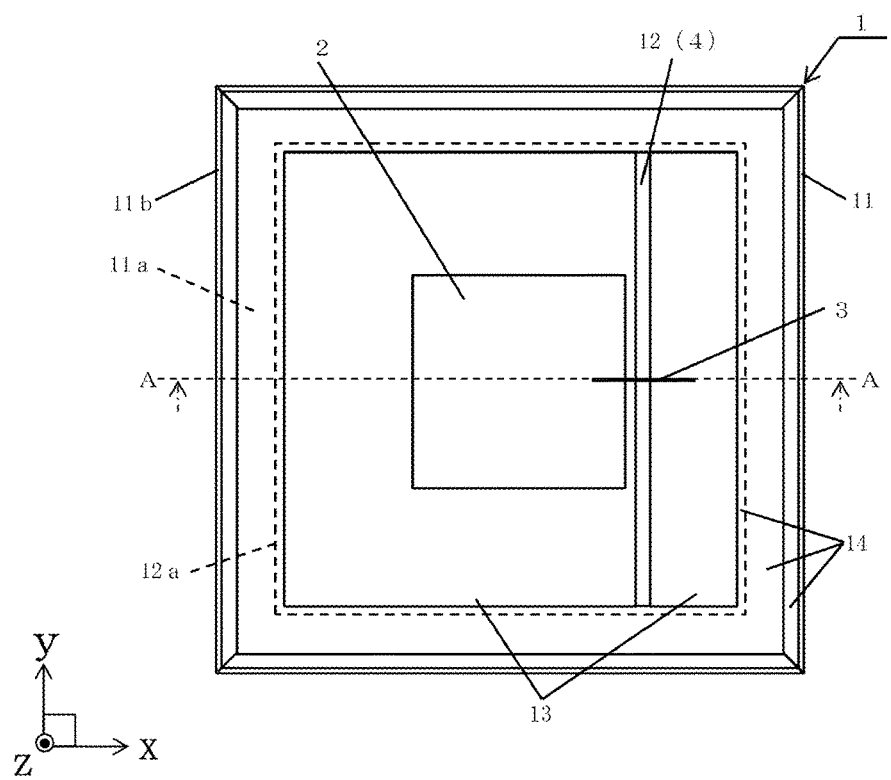
FIG. 1A is a top face view of a light-emitting device according to a first embodiment of the present invention.
Figure 1B:
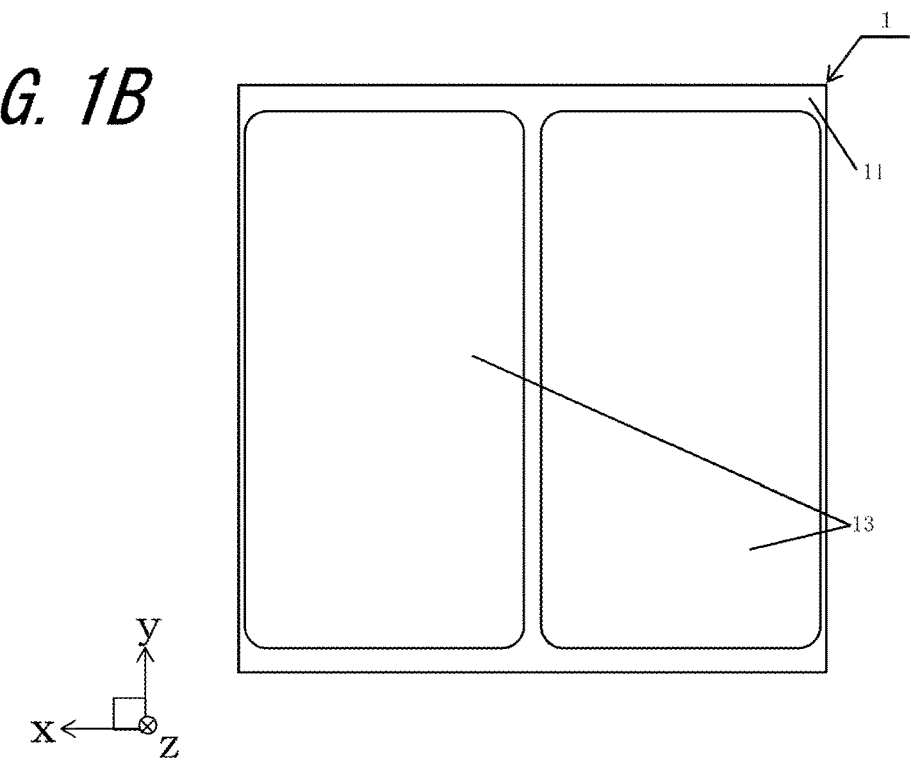
FIG. 1B is a bottom face view of the light-emitting device in FIG. 1A.

The light-emitter mounting package 1 according to the present embodiment includes an insulating base 11 including a main surface 11a having a recess 12, in which the light emitter 2 is mountable, and including side surfaces each including a sloping surface 11b adjacent to the main surface 11a, and wiring conductors 13 arranged on a peripheral portion of the recess 12 that is adjacent to inner walls 12a of the recess 12. Each wiring conductor 13 extends from the bottom surface of the recess 12, and inside of the insulating base 11, and toward the main surface 11a of the insulating base 11. The light-emitter mounting package 1 includes a metal layer 14. The metal layer 14 is spaced from the wiring conductors 13, and covers the inner walls 12a of the recess 12, the main surface 11a, and the sloping surfaces 11b. In FIG. 1A, the area indicated with a dotted line corresponds to the inner walls of the recess 12 in a perspective view from above. In FIGS. 1A to 2B, the light-emitting device is arranged in a virtual xyz space. For descriptive purposes, the upward direction hereafter refers to a positive direction of the virtual z-axis. The upward and downward directions are hereafter used for descriptive purposes, and do not limit the directions in, for example, actual use of the light-emitter mounting package 1.

The insulating base 11 has a recess 12 in its main surface 11a, which is a first main surface (upper surface in FIGS. 1A to 2B), and is a rectangular plate as viewed from above. Each side surface of the insulating base 11 includes a sloping surface 11b adjacent to the first main surface. The sloping surfaces 11b extend like belts along the outer edges of the insulating base 11 as viewed from above, on the four sides of the insulating base 11. The insulating base 11 serves as a support for the light emitter 2. The light emitter 2 is bonded to and fixed onto the wiring conductors 13, which are arranged on the bottom surface of the recess 12, with a bonding member such as a low-melting point brazing material or a conductive resin.

The insulating base 11 may be formed from, for example, a ceramic such as sintered aluminum oxide (alumina ceramic), sintered aluminum nitride, sintered mullite, or sintered glass ceramic.

For the insulating base 11 formed from sintered aluminum nitride, for example, the powdery raw materials including aluminum nitride serving as a main component and yttria or erbia serving as a sintering aid are mixed with an appropriate organic binder and a solvent to form slurry. The slurry is then shaped into a sheet using a doctor blade or by calendering to obtain a ceramic green sheet. The ceramic green sheet then undergoes appropriate punching. Multiple ceramic green sheets prepared in this manner are then laminated on one another to form a green laminating body for the insulating base 11. The green laminating body is then fired at high temperature (about 1800° C.) to complete the insulating base 11. Aluminum nitride serving as a main component is a material with an aluminum nitride content in the insulating base 11 higher than or equal to 80% by mass when the mass of the entire insulating base 11 is 100% by mass. In some embodiments, the insulating base 11 has an aluminum nitride content of higher than or equal to 95% by mass. The insulating base 11 with an aluminum nitride content of higher than or equal to 95% by mass can easily have a thermal conductivity of higher than or equal to 150 W/mK. The resultant light-emitter mounting package 1 can have high heat dissipation.

The recess 12 is formed in the first main surface (upper surface of the insulating base 11 in FIGS. 1A to 2B) of the insulating base 11. The recess 12 receives the light emitter 2, which is then mounted on its bottom surface. In the example shown in FIG. 1A, the recess 12 is rectangular as viewed from above. To form this recess 12, multiple ceramic green sheets, which are to be the insulating base 11, undergo laser processing or punching using a die to form a through-hole in each ceramic green sheet, and these ceramic green sheets are laminated on another ceramic green sheet with no through-hole.

In the example shown in FIGS. 1A to 2B, the wiring conductors 13 are arranged on the bottom surface of the recess 12 of the insulating base 11, inside the insulating base 11, on the second main surface (lower surface) of the insulating base 11, and on the peripheral portion of the bottom surface of the recess 12 adjacent to the inner walls 12a. First ends of the wiring conductors 13 extend on, for example, the bottom surface of the recess 12 and are arranged on the peripheral portion of the recess 12 adjacent to the inner walls 12a. Second ends of the wiring conductors 13 extend to the second main surface (lower surface in FIGS. 1A to 2B) of the insulating base 11. The wiring conductors 13 electrically connect the external module substrate 5 to the light emitter 2 mounted on the light-emitter mounting package 1. The wiring conductors 13 include feedthrough conductors that electrically connect wiring conductors arranged on the bottom surface of the recess 12 of the insulating base 11 or inside the insulating base 11 to wiring conductors on the second main surface through the insulator layers included in the insulating base 11.

The wiring conductors 13 may be formed from metal materials such as tungsten (W), molybdenum (Mo), manganese (Mn), silver (Ag), or copper (Cu). For the insulating base 11 formed from sintered aluminum nitride, for example, a conductor paste for the wiring conductors 13 containing powdery refractory metal, such as W, Mo, or Mn, mixed with an appropriate organic binder and a solvent is preliminarily applied in a predetermined pattern by screen printing on a ceramic green sheet, which is to be the insulating base 11. The printed paste, together with the ceramic green sheet to be the insulating base 11, is fired and applied at predetermined positions on the insulating base 11. To form feedthrough conductors as the wiring conductors 13, through-holes are formed in the green sheet by punching using a die or by laser processing. The through-holes are then filled with a conductor paste for the wiring conductors 13 by printing.

The exposed surface of each wiring conductor 13 is covered with a plating layer deposited by electroplating or electroless plating. The plating layer is formed from metals with high corrosion resistance and connectivity with a connection member 3, such as nickel, copper, gold, or silver. For example, a nickel plating layer with a thickness of about 0.5 to 5 μm and a gold plating layer with a thickness of about 0.1 to 3 μm are successively deposited on the surface. The plating effectively reduces corrosion of the wiring conductors 13, and strengthens the joint between the wiring conductors 13 and the light emitter 2 using a bonding member, the joint between the wiring conductors 13 and the connection member 3, such as a bonding wire, and the joint between the wiring conductors 13 and wires for the external module substrate 5.

The plating layer may not be Ni/Au plating layers, but may be, for example, any other plating layers including Ni/Pd/Au plating layers.

A silver plating layer with a thickness of about 1 to 10 μm may be deposited on the exposed surface of each wiring conductor 13 on the insulating base 11. When the silver plating layer is deposited on the outermost surface of each wiring conductor 13, the light-emitting device can efficiently reflect light emitted from the light emitter 2 toward the wiring conductors 13.

For the wiring conductor 13 on which the light emitter 2 is mounted, a silver plating layer may be deposited on its outermost surface. For each of the other wiring conductors 13, a gold plating layer may be deposited on its outermost surface. This is because a gold plating layer more firmly joins with the connection member 3 and with a connection pad 51 on the external module substrate 5 than a silver plating layer with a higher light reflectance than the gold plating layer. A plating layer deposited on the outermost surface of each wiring conductor 13 may be an alloy layer of silver and gold, which is for example a sliver-gold alloy plating layer of an all-proportional solid solution.

A copper plating layer having a thickness of about 10 to 80 μm may be deposited on the wiring conductor 13 on which the light emitter 2 is to be mounted. For example, a copper plating layer with a thickness of about 10 to 80 μm may be arranged between a nickel plating layer and a gold plating layer to allow the wiring conductors 13 to have higher thermal conductivity and allow the light emitter 2 to efficiently transfer heat to the light-emitter mounting package 1. In the same manner, a copper plating layer having a thickness of about 10 to 80 μm may be deposited on the wiring conductors 13 on the lower surface of the insulating base 11 to allow the light-emitter mounting package 1 to transfer heat efficiently to the external module substrate 5.

Figure 2A:
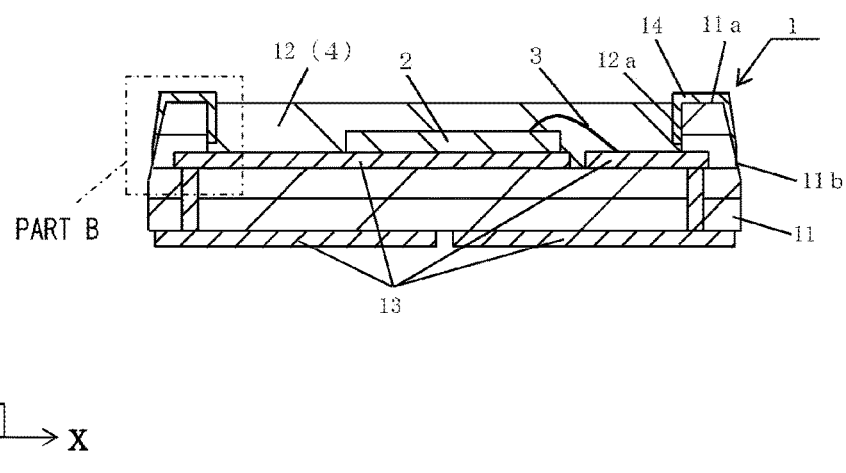
FIG. 2A is a longitudinal-sectional view of the light-emitting device taken along line A-A of FIG. 1A.
Figure 2B:
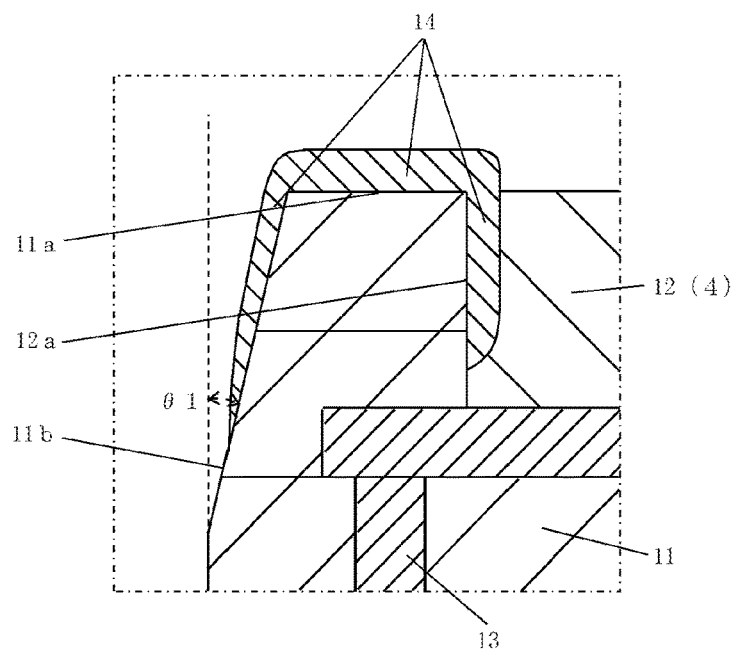
FIG. 2B is an enlarged longitudinal-sectional view of part B in FIG. 2A.

The metal layer 14 is spaced from the wiring conductors 13, and covers the inner walls 12a of the recess 12, the main surface 11a, and the sloping surfaces 11b. The metal layer 14 being spaced from the wiring conductors 13 herein intends to mean that the wiring conductors 13 and the metal layer 14 are electrically insulated from each other. As shown in FIGS. 2A and 2B, for example, when the wiring conductors 13 extend from the bottom surface of the recess 12 to the inside of the walls of the recess 12, one end of the metal layer 14 is spaced from the bottom surface of the recess 12, or specifically the metal layer 14 extends from a middle portion of each inner wall 12a of the recess 12. In this case, the metal layer 14 extends from a middle portion of each inner wall 12a of the recess 12 at a distance of, for example, about 0.05 to 0.2 mm from the bottom surface of the recess 12. The other end of the metal layer 14 on the inner walls 12a of the recess 12 may be nearer the bottom surface of the recess 12 than the emission surface of the light emitter 2 mounted on the bottom surface of the recess 12. The metal layer 14 is deposited on the entire main surface 11a surrounding the recess 12 as viewed from above, and extends over the sloping surfaces 11b on the four sides of the insulating base 11. In the structure including the metal layer 14 extending from the inner walls 12a of the recess 12 to the main surface 11a and the sloping surfaces 11b, light emitted from the light emitter 2, which irregularly reflects inside the insulating base 11 is effectively prevented from passing through the upper surface or the side surfaces of the insulating base 11.

The sloping surface 11b of each side surface of the insulating base 11 has an inclination angle θ1 of 5 to 20 degrees. The inclination angle θ1 is an angle between the sloping surface 11b and an extension line of the side surface of the insulating base 11 excluding the sloping surface 11b as in the example of FIG. 2B. The sloping surfaces 11b on the four sides of the insulating base 11 may have the same inclination angle or may have different inclination angles. For example, each sloping surface 11b may have a larger inclination angle at a certain depth from the main surface 11a (in z direction), or may have a different inclination angle to check the orientation of the light-emitter mounting package 1 as viewed from plane.

The metal layer 14 is formed from a metal having higher reflectance of light from the light emitter 2 than the insulating base 11, such as aluminum or silver. The metal layer 14 may particularly be formed from a metal having higher reflectance than the wiring conductors 13 or than the plating layer deposited on the exposed surface of each wiring conductor 13. For example, when the wiring conductors 13 contain tungsten as a main component and the outermost plating layer deposited on the exposed surface of each wiring conductor 13 is formed from gold, the metal layer 14 formed from a metal having higher reflectance such as aluminum is selected as appropriate. The metal layer 14 is deposited in areas covering the inner walls 12a of the recess 12, the main surface 11a, and the sloping surfaces 11b with a thin film deposition technique, such as vapor deposition, ion plating, or sputtering. To enhance the adhesion between the insulating base 11 and the metal layer 14, an adhesive layer may be arranged between the insulating base 11 and the metal layer 14.

The metal layer 14 described above may be formed by, for example, the method described below.

Figure 3A:
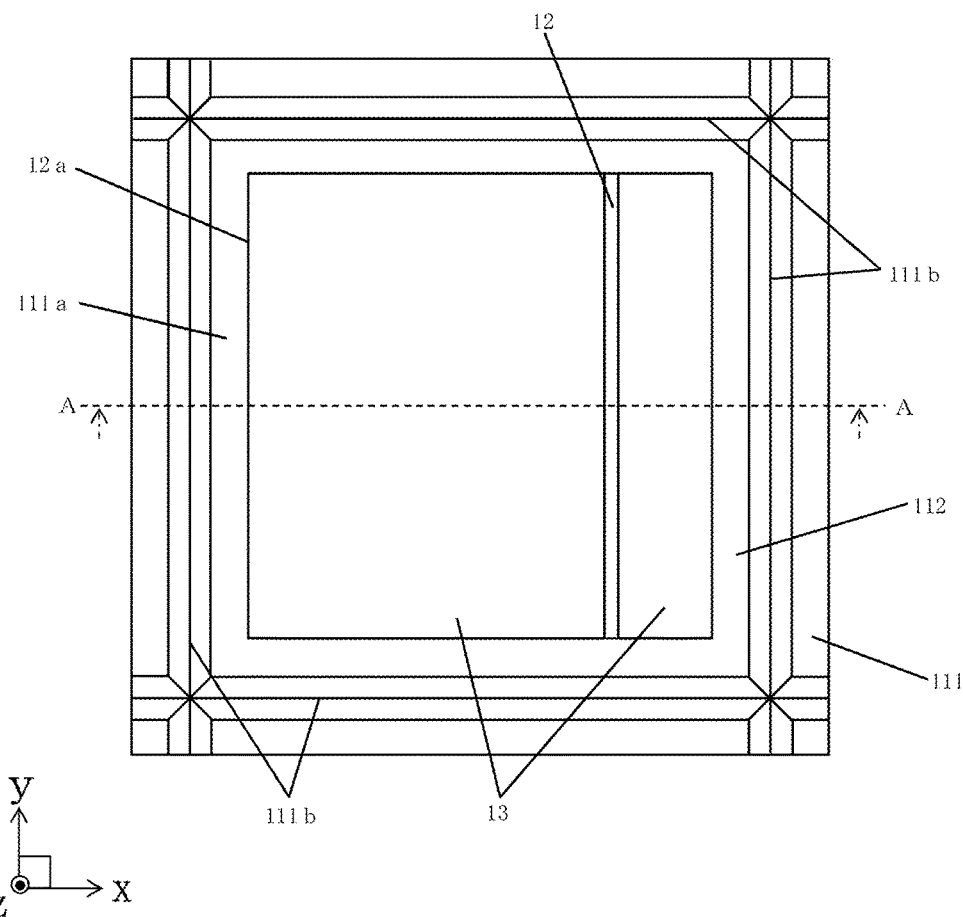
FIG. 3A is a top face view describing a process included in a method for fabricating a light-emitter mounting package included in the light-emitting device in FIGS. 1A and 1B.
Figure 3B:
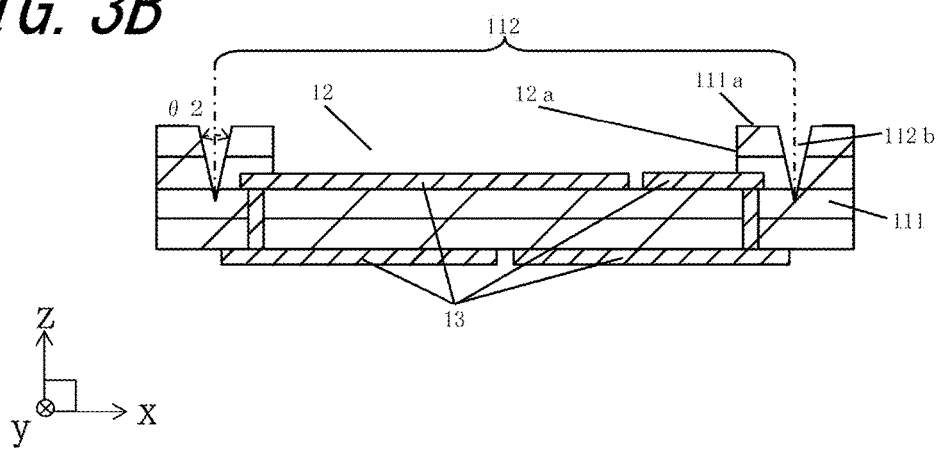
FIG. 3B is a longitudinal-sectional view taken along line A-A of FIG. 3A.

As in the example shown in FIGS. 3A and 3B, an insulating mother substrate 111 having a main surface 111a and internal wiring conductors 13 is prepared. The insulating mother substrate 111 has, in its central portion, an area 112, which is to be the insulating base 11 having the recess 12, on the main surface 111a. Grooves 111b each having a V-shaped section are formed along the four outer edges of the area 112, which is to be the insulating base 11. The V-shaped grooves 111b may be formed by, for example, V-shaped cuts formed using a cutting blade along the four outer edges of the area 112, which is to be the insulating base 11, in the first main surface of the green laminating body for the insulating mother substrate 111. In the example shown in FIGS. 3A and 3B, the V-shaped grooves 111b each include an inner surface adjacent to the area 112 to be the insulating base 11 and an inner surface adjacent to the other area, which have the same inclination. However, the V-shaped grooves 111b may each have an inner surface adjacent to the area 112 to be the insulating base 11, and an inner surface adjacent to the other area, which may have different inclinations. For example, the inner surface adjacent to the area 112, which is to be the insulating base 11, has an inclination angle of 15 degrees and the inner surface adjacent to the other area is perpendicular to the main surface 111a of the insulating mother substrate 111 (with an inclination angle of 0 degrees).

Before the metal layer 14 is deposited on the insulating base 11, the exposed surface of each wiring conductor 13 may be preliminary covered with the above plating layer. This prevents the surface of the metal layer 14 from being altered by, for example, a plating solution during fabrication of the light-emitter mounting package 1.

Figure 4A:
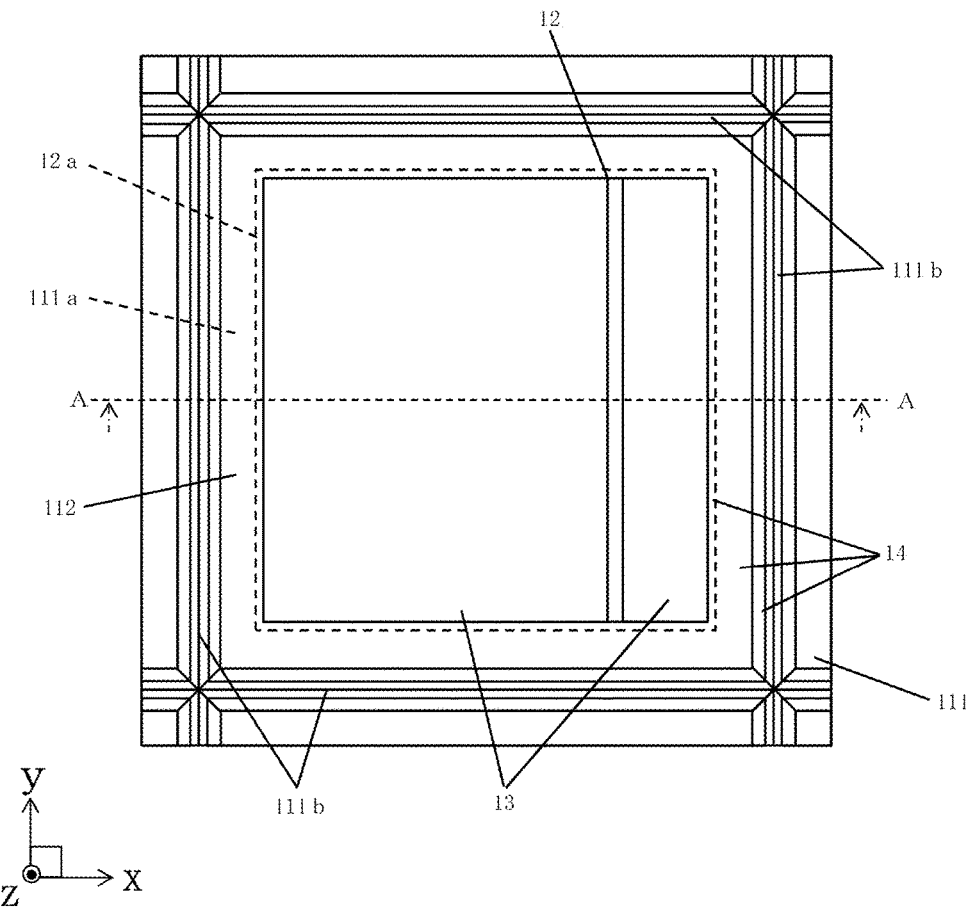
FIG. 4A is a top face view describing a process included in the method for fabricating the light-emitter mounting package included in the light-emitting device in FIGS. 1A and 1B.
Figure 4B:
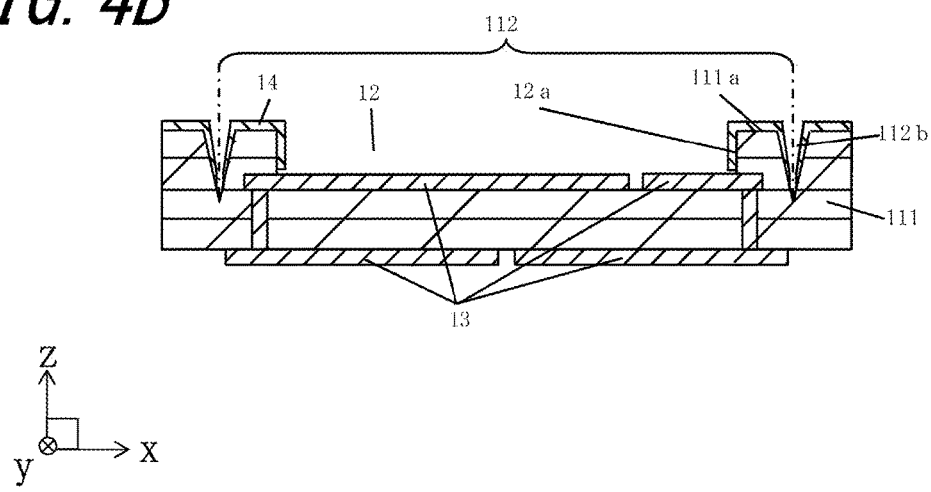
FIG. 4B is a longitudinal-sectional view taken along line A-A of FIG. 4A.

Subsequently, as shown in FIGS. 4A and 4B, the metal layer 14 is formed on the inner walls 12a of the recess 12, the main surface 111a of the insulating mother substrate 111, and the inner surfaces of the V-shaped grooves 111b. The metal layer 14 is a continuous layer covering the inner walls 12a of the recess 12, the main surface 11a, and the inner surfaces of the V-shaped grooves 111b. The bottom surface of the recess 12 and the surfaces of the wiring conductors 13 may be covered with, for example, a shielding plate or a film to prevent the metal layer 14 from being deposited on the bottom surface of the recess 12 and the surfaces of the wiring conductors 13, and the resultant metal layer 14 may be spaced from the wiring conductors 13.

Figure 5A:
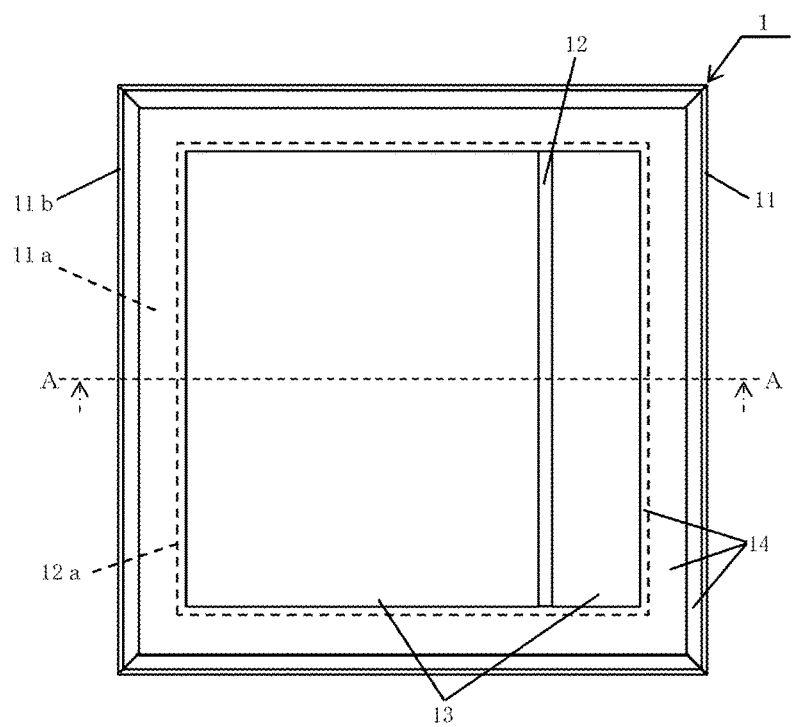
FIG. 5A is a top face view describing a process included in the method for fabricating the light-emitter mounting package included in the light-emitting device in FIGS. 1A and 1B.
Figure 5B:
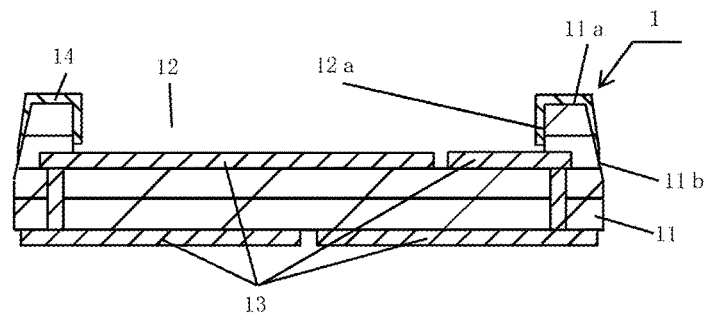
FIG. 5B is a longitudinal-sectional view taken along line A-A of FIG. 5A.

Finally, the area 112, which is to be the insulating base 11, is separated from the other area along the V-shaped grooves 111b. The light-emitter mounting package 1 can thus include the metal layer 14 extending from the inner walls 12a of the recess 12 to the main surface 11a and the sloping surfaces 11b as shown in FIGS. 5A and 5B. The area 112, which is to be the insulating base 11, may be separated from the other area by, for example, cutting along the V-shaped grooves 111b. In the process shown in FIGS. 4A and 4B, the metal layer 14 is prevented from being deposited on the bottoms of the grooves 111b. This prevents the resultant metal layer 14 from being delaminated from the sloping surfaces 11b under stress occurring when the insulating mother substrate 111 is cut into the area 112 to be the insulating base 11 and the other area. This allows appropriate formation of the metal layer 14 covering the inner walls 12a of the recess 12, the main surface 11a, and the sloping surfaces 11b.

The V-shaped grooves 111b each have an interior angle θ2 of 10 to 40 degrees. Appropriate formation of the metal layer 14 on the inner surface of each groove 111b, which has a narrow width toward its bottom, prevents the resultant metal layer 14 from being deposited on the bottom of each groove 111b. The resultant light-emitter mounting package 1 includes the metal layer 14 appropriately covering the inner walls 12a of the recess 12, the main surface 11a, and the sloping surfaces 11b.

Further, small-sized light-emitter mounting packages 1 may be fabricated from a multi-piece substrate in which the areas 112, which are to be multiple insulating bases 11, are arranged in a matrix for easy handling and efficient fabrication of multiple packages. In this case, the V-shaped grooves 111b are formed along the outer edges of the areas 112, which are to be individual insulating bases 11, and the metal layers 14 are formed concurrently in the multiple areas 112, which are to be multiple insulating bases 11. This structure allows efficient formation of the light-emitter mounting packages 1 each including the metal layer 14 covering the inner walls 12a of the recess 12, the main surface 11a, and the sloping surfaces 11b.

The light-emitter mounting package 1 can serve as a light-emitting device after the light emitter 2 is mounted in the recess 12 and the electrode of the light emitter 2 is connected to the wiring conductors 13. For wire bonding, the light emitter 2 is first fixed onto the wiring conductors 13 with a bonding member such as solder, and the electrode of the light emitter 2 is electrically connected to the wiring conductors 13 with the connection member 3, such as a bonding wire. In this manner, the light emitter 2 is mounted onto the light-emitter mounting package 1 by wire bonding. For flip-chip connection, the electrode of the light emitter 2 is electrically and mechanically connected to the wiring conductors 13 with the connection member 3, such as solder bumps or gold bumps. In this manner, the light emitter 2 is mounted onto the light-emitter mounting package 1 by flip-chip.

The light emitter 2 may be sealed with an encapsulant 4, such as resin or glass, or may be sealed with a lid, such as a resin or glass lid as appropriate. The light-emitter mounting package 1 may include a plurality of light emitters 2 or a small electronic component, such as a Zener diode, mounted in the recess 12.

Figure 6:
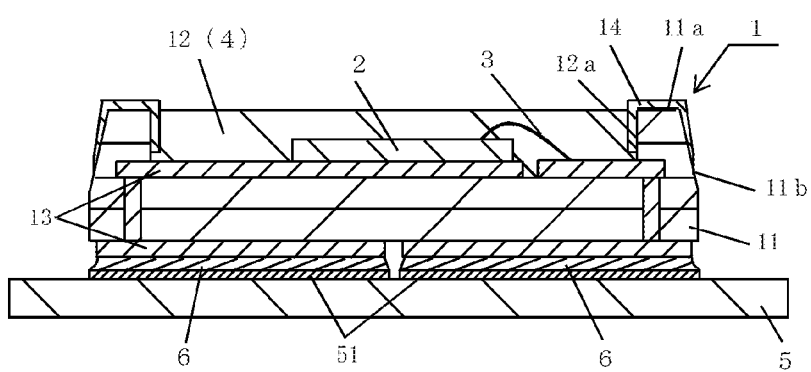
FIG. 6 is a longitudinal-sectional view of a light-emitting module including the light-emitting device in FIGS. 1A and 1B mounted on a module substrate.

As in the example of FIG. 6, the light-emitting device according to the embodiment of the present invention can serve as a light-emitting module after connected to the connection pads 51 on the external module substrate 5 with a bonding member 6 such as solder.

The light-emitter mounting package 1 according to the present embodiment includes the insulating base 11 including the main surface 11a having the recess 12, in which the light emitter 2 is mountable, and the side surfaces each including the sloping surface 11b adjacent to the main surface 11, the wiring conductors 13 arranged on the peripheral portion of the bottom surface of the recess 12 adjacent to the inner walls 12a, and the metal layer 14 spaced from the wiring conductors 13 and covering the inner walls 12a of the recess 12, the main surface 11a, and the sloping surfaces 11b. The metal layer 14 thus effectively reduces light passing through the walls of the recess 12 and leaking outside.

As in the example of FIGS. 2A and 2B, in the thickness direction of the insulating base 11, the distance between one end of the metal layer 14 on its side surfaces and the main surface 11a is greater than the distance between the other end of the metal layer 14 on the inner walls 12a and the main surface 11. This metal layer 14 effectively reduces light passing through the walls of the recess 12 and leaking outside from the side surfaces of the insulating base 11.

As in the example of FIGS. 2A and 2B, in the thickness direction of the insulating base 11, the distance between the end of the metal layer 14 on the side surfaces and the main surface 11a is greater than the depth of the recess 12. This metal layer 14 effectively reduces light passing through the walls of the recess 12 and leaking outside from the side surfaces of the insulating base 11. As in the example of FIGS. 2A and 2B, the length of each sloping surface 11b (length from the main surface 11a to the end of the sloping surface 11b in the thickness direction of the insulating base 11) may be greater than the depth of the recess 12 (depth from the main surface 11a to the bottom surface of the recess 12 in the thickness direction of the insulating base 11) to have the distance between the end of the metal layer 14 on the side surfaces and the main surface 11a greater than the depth of the recess 12.

Figure 7:
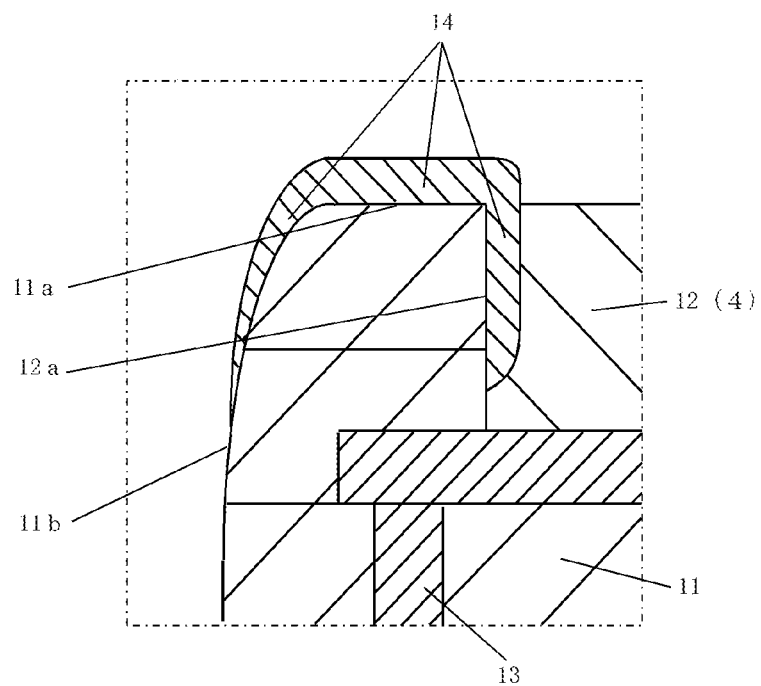
FIG. 7 is an enlarged longitudinal-sectional view of a main part of the light-emitting device according to a modification of the first embodiment of the present invention.
Figure 7:
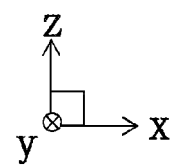

As in the example of FIG. 7, each sloping surface 11b of the insulating base 11 may curve outwardly as viewed in longitudinal section. When the structure having each sloping surface 11b curving outwardly as viewed in longitudinal section is formed using the insulating mother substrate 111 as described above, the metal layer 14 can be appropriately formed on the inner walls 12a of the recess 12, the main surface 111a of the insulating mother substrate 111, and the inner surface of the groove 111b. With the inner surface of the groove 111b of the insulating mother substrate 111 having a larger interior angle and the groove 111b wider toward the main surface 111a, the metal layer 14 can be appropriately formed on the inner surface of the groove 111b of the insulating mother substrate 111 adjacent to the main surface 111a. With the inner surface of the groove 111b having a smaller interior angle and the groove 111b narrower toward its bottom, the metal layer 14 is prevented from being deposited on the bottom of the groove 111b. The resultant emitter mounting package 1 can have the metal layer 14 appropriately covering the inner walls 12a of the recess 12, the main surface 11a of the insulating base 11, and the sloping surfaces 11b. When each sloping surface 11b curves in a convex, the inclination angle of the imaginary line connecting the upper and the lower ends of the sloping surface 11b may fall within the above range of the inclination angle θ1 of the sloping surface 11b.

The main surface 11a of the insulating base 11 and the sloping surfaces 11b are flatter (with less surface irregularity) than the inner walls 12a of the recess 12. When the encapsulant 4 is placed in the recess 12, the surface irregularity of the inner walls 12a of the recess 12 increases the adhesion between the metal layer 14 and the encapsulant 4, and enhances the sealing performance of the encapsulant 4 in the recess 12. Such surface irregularity also increases the adhesion between the insulating base 11 and the metal layer 14 on the main surface 11a and the sloping surfaces 11b of the insulating base 11. The resultant light-emitter mounting package 1 has high reliability. As in the example of FIGS. 3A to 5B, when, for example, the light-emitter mounting package 1 is separated along the grooves 111b, the side surfaces of the insulating base 11 excluding the sloping surfaces 11b can have more irregularity than the sloping surfaces 11b. The end portion of the metal layer 14 placed in the groove 111b is less likely to be delaminated from the insulating base 11. The resultant light-emitter mounting package 1 can have the metal layer 14 appropriately covering the inner walls 12a of the recess 12, the main surface 11a, and the sloping surfaces 11b.

A light-emitting device according to the present embodiment includes the light-emitter mounting package 1 with the above structure and the light emitter 2 mounted in the recess 12 of the light-emitter mounting package 1. The resultant light-emitting device can have a small size and high luminance.

A light-emitting module according to the present embodiment includes the light-emitting device with the above structure connected to the connection pad 51 on the module substrate 5 using the bonding member 6. The resultant light-emitting module can have a small size and high luminance.

The light-emitter mounting package 1 according to the first embodiment of the present invention is effectively usable as a small-sized light-emitter mounting package including a dark-color insulating base 11 as the insulating base 11.

The light-emitter mounting package 1 according to the first embodiment of the present invention is effectively usable as a light-emitter mounting package 1 for a light-emitting device including a short-wavelength light emitter 2, such as a light-emitting device included in an ultraviolet (UV) light-emitting device.

Second Embodiment

A light-emitting device according to a second embodiment of the present invention will now be described with reference to FIGS. 8A to 9B.

The light-emitting device according to the second embodiment of the present invention differs from the light-emitting device according to the first embodiment in that each side surface of the insulating base 11 includes multiple sloping surfaces with different inclination angles, or specifically a first sloping surface and a second sloping surface with different inclination angles as shown in FIGS. 8A to 9B.

In the second embodiment, each sloping surface 11b includes the first sloping surface, which is adjacent to the second main surface of the insulating base 11 opposite to the main surface 11a (lower surface of the insulating base 11 in FIGS. 8A to 9B), and the second sloping surface nearer the first main surface 11a of the insulating base 11 than the first sloping surface (upper surface of the insulating base 11 in FIGS. 8A to 9B). The second sloping surface has a larger inclination angle than the first sloping surface.

The light-emitter mounting package 1 according to the present embodiment includes the metal layer 14 that effectively reduces light passing through the walls of the recess 12 and leaking outside, in the same manner as in the light-emitter mounting package 1 according to the first embodiment.

In the structure including each side surface of the insulating base 11 including multiple sloping surfaces 11b with different inclination angles, the angle between the first sloping surface and the side surface of the insulating base 11 excluding the sloping surface 11b, the angle between the first sloping surface and the second sloping surface, and the angle (interior angle) between the second sloping surface and the main surface 11a of the insulating base 11 can be larger obtuse angles than in the structure including each side surface having the sloping surface 11b defining a single straight line as viewed in longitudinal section in the light-emitter mounting package 1 according to the first embodiment. This structure improves connection between portions of the metal layer 14 at the joint between adjacent surfaces. The resultant light-emitter mounting package 1 can have the metal layer 14 appropriately covering the inner walls 12a of the recess 12, the main surface 11a of the insulating base 11, and the sloping surfaces 11b. In the structure including each sloping surface 11b having multiple sloping surfaces, the angle between the imaginary line connecting the upper and lower ends of the sloping surface 11b and the extension line of each side surface of the insulating base 11 excluding the sloping surface 11b may fall within the range of the inclination angle θ1 of the sloping surface 11b according to the first embodiment.

The light-emitter mounting package 1 according to the second embodiment can be fabricated with, for example, the procedure described below.

In the same manner as described in the first embodiment, an insulating mother substrate 111 is prepared first. The insulating mother substrate 111 has an area 112, which is to be the insulating base 11 having the recess 12 on its main surface 111a in a central portion of the insulating mother substrate 111. The insulating mother substrate 111 has grooves 111b along the four outer edges of the area 112, which is to be the insulating base 11. As viewed in longitudinal section, each groove 111b has different interior angles of its inner surface portion adjacent to the first main surface 111a (the opening) of the insulating mother substrate 111 and its inner surface portion adjacent to the bottom. In other words, each groove 111b has the first sloping surface adjacent to the bottom, and the second sloping surface adjacent to the first main surface 111a (the opening) of the insulating mother substrate 111. The second sloping surface has a larger interior angle than the first sloping surface. These grooves 111b are, for example, cut in the first main surface of the green laminating body for the insulating mother substrate 111, which is to be the insulating base 11, along the four outer edges of the area 112 using a cutting blade having different blade angles. In the same manner as described in the first embodiment, this structure also allows, when the light-emitter mounting package 1 is fabricated from the insulating mother substrate 111, the metal layer 14 to be easily formed on the second sloping surface of the groove 111b adjacent to the main surface 111a of the insulating mother substrate 111 and prevents the metal layer 14 from being formed on the first sloping surface adjacent to the bottom of the groove 111b. The resultant light-emitter mounting package 1 has the metal layer 14 appropriately covering the inner walls 12a of the recess 12, the main surface 11a of the insulating base 11, and the sloping surfaces 11b. The light-emitter mounting package according to the second embodiment may also be fabricated using a multi-piece substrate in which the areas 112 to be multiple insulating bases 11 are arranged in a matrix.

The grooves 111b each having different interior angles of its inner surface portion adjacent to the first main surface 111a (the opening) of the insulating mother substrate 111 and its inner surface portion adjacent to the bottom as viewed in longitudinal section may be formed by, for example, removing the bottom of each V-shaped groove 111b and the end portion of the metal layer 14 through laser processing after the V-shaped grooves 111b are formed on the insulating mother substrate 111 and the metal layer 14 is formed on the entire inner surfaces of the V-shaped grooves 111b. In this case, the length of the first sloping surface can be adjusted easily, and the end of the metal layer 14 can be arranged at the boundary between the first sloping surface and the second sloping surface. The resultant light-emitter mounting package 1 has the metal layer 14 appropriately covering the sloping surfaces.

The light-emitter mounting package 1 may include a sloping surface 11b including an outwardly curved first sloping surface and a straight second sloping surface as viewed in longitudinal section.

A light-emitter mounting layer 15 may be formed on the bottom surface of the recess 12 or a central terminal layer 16 may be formed on the second main surface of the insulating base 11 (lower surface of the insulating base 11 in FIGS. 8A to 9B). The light-emitter mounting layer 15 and the central terminal layer 16 can be formed from the same material and with the same method as for the wiring conductors 13 described above. Exposed surface portions of the light-emitter mounting layer 15 and the central terminal layer 16 are covered by the same plating layer as used for the wiring conductors 13. The light-emitter mounting layer 15 is used for, for example, mounting the light emitter 2. The central terminal layer 16 is used for, for example, joining the structure to the connection pad 51 on the external module substrate 5 in the same manner as described for the wiring conductors 13 on the second main surface of the insulating base 11.

Figure 8A:
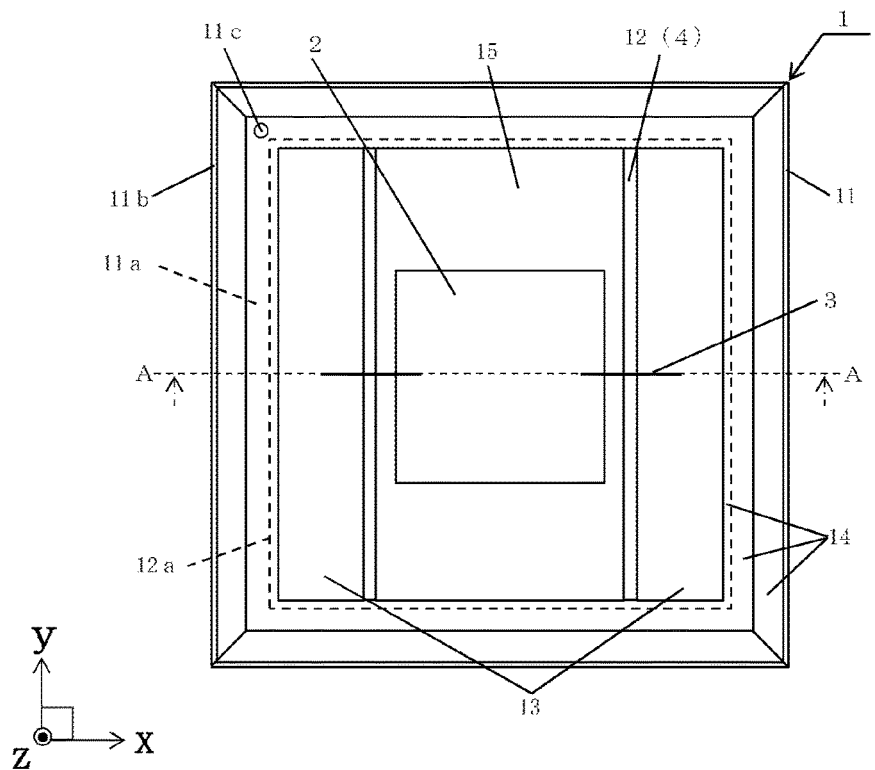
FIG. 8A is a top face view of a light-emitting device according to a second embodiment of the present invention.
Figure 8B:
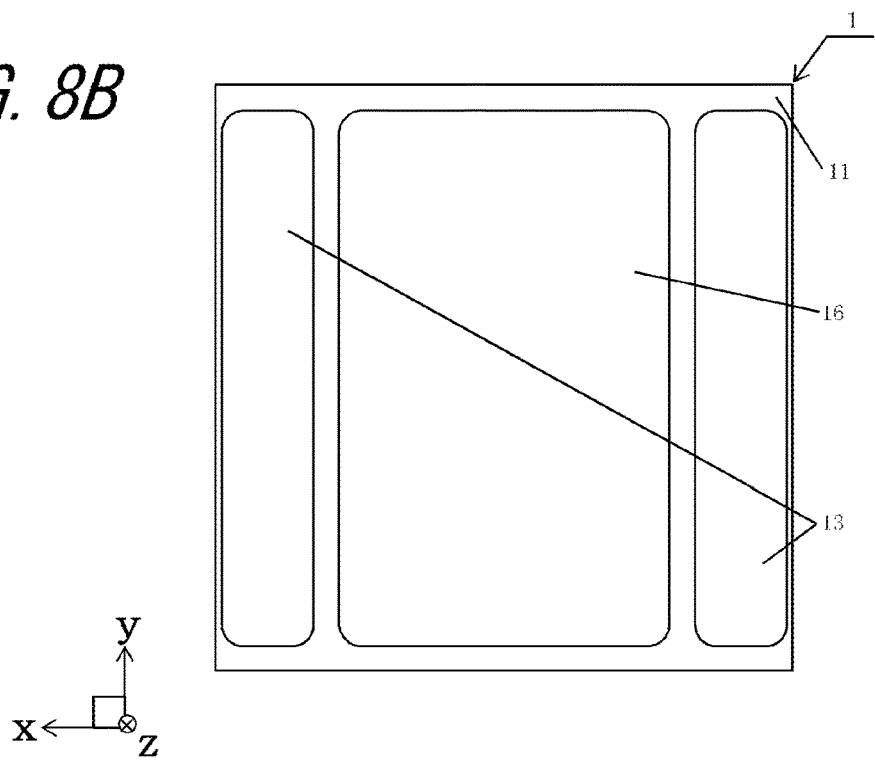
FIG. 8B is a bottom face view of the light-emitting device in FIG. 8A.
Figure 9A:
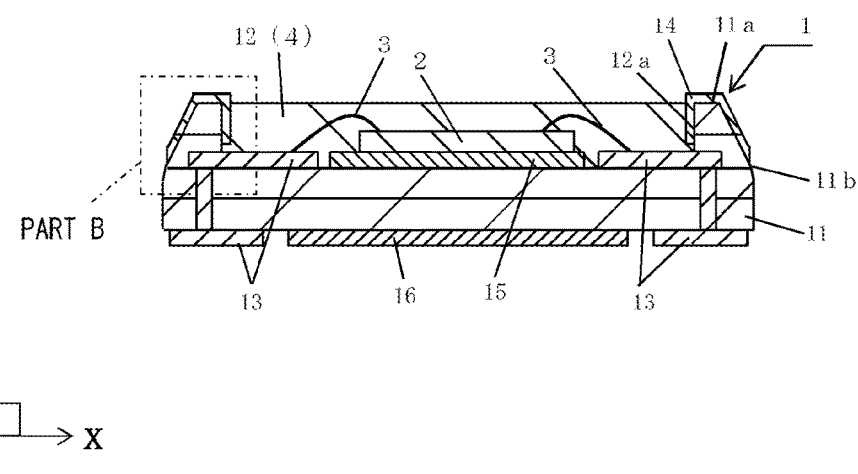
FIG. 9A is a longitudinal-sectional view taken along line A-A of FIG. 8A.
Figure 9B:
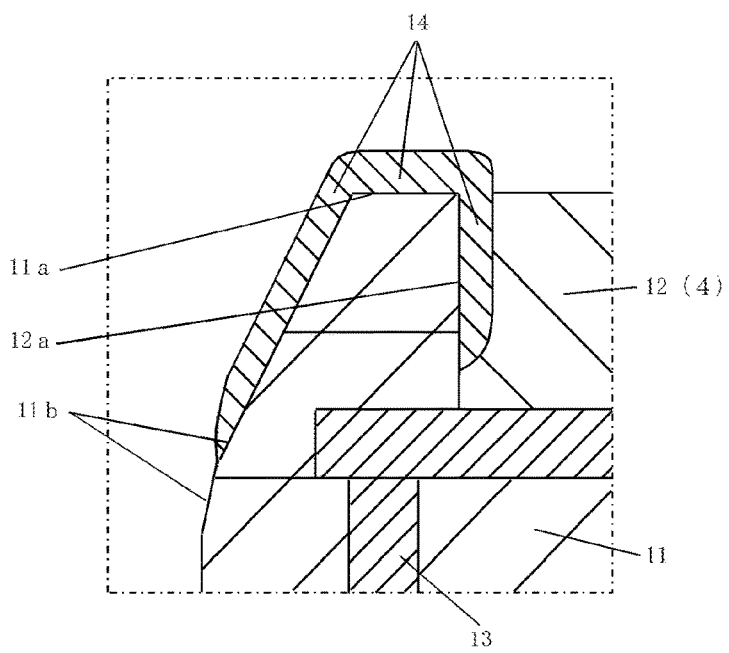
FIG. 9B is an enlarged longitudinal-sectional view of part B in FIG. 9A.
Figure 10A:
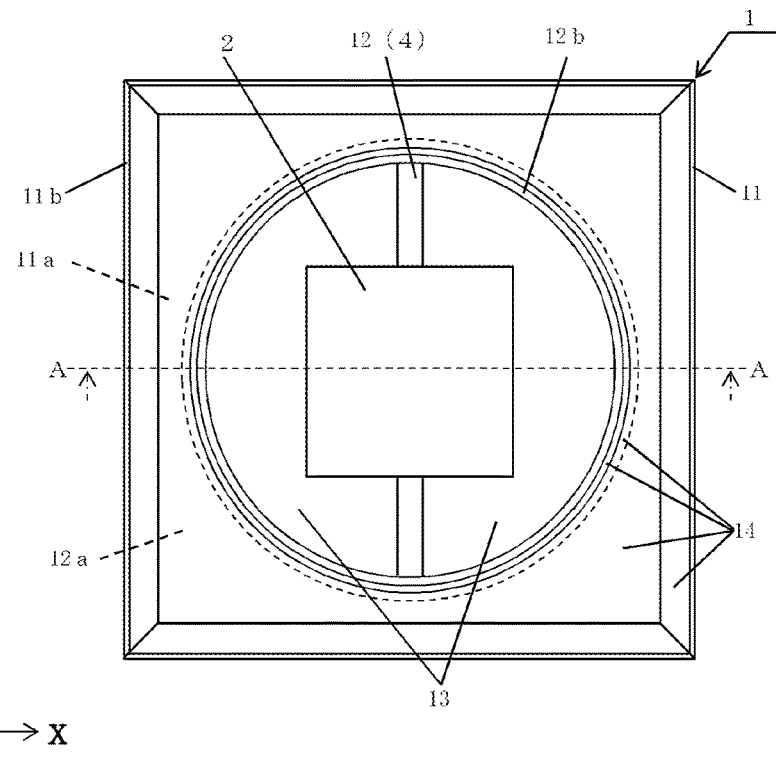
FIG. 10A is a top face view of a light-emitting device according to a third embodiment of the present invention.
Figure 10B:
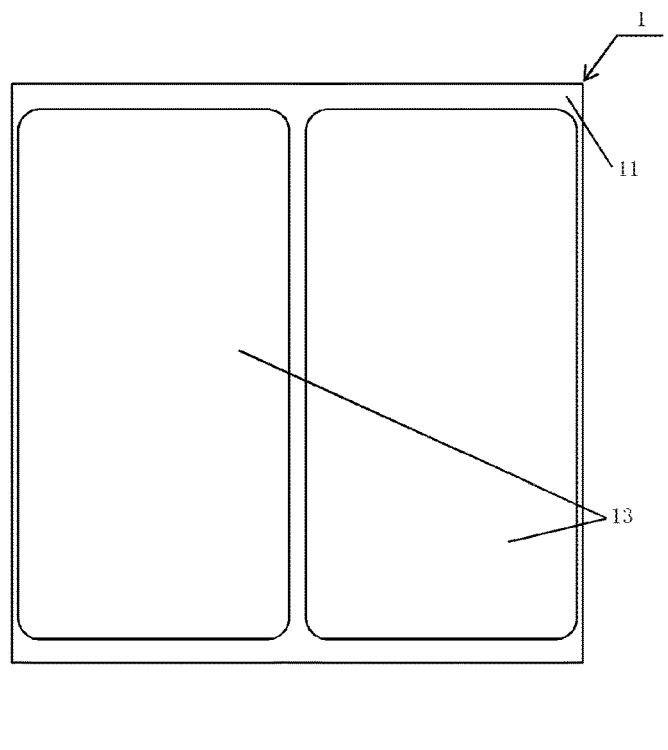
FIG. 10B is a bottom face view of the light-emitting device in FIG. 10A.
Figure 11A:
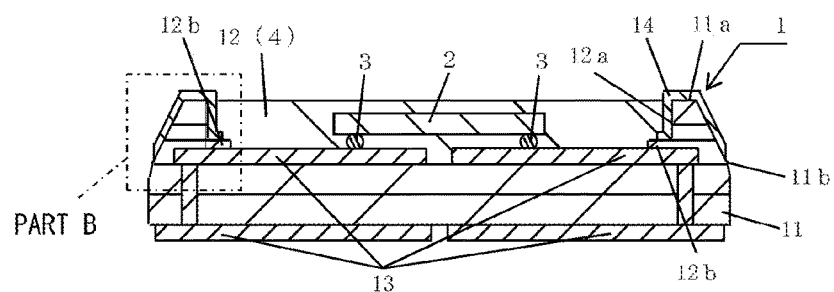
FIG. 11A is a longitudinal-sectional view taken along line A-A of FIG. 10A.
Figure 11B:
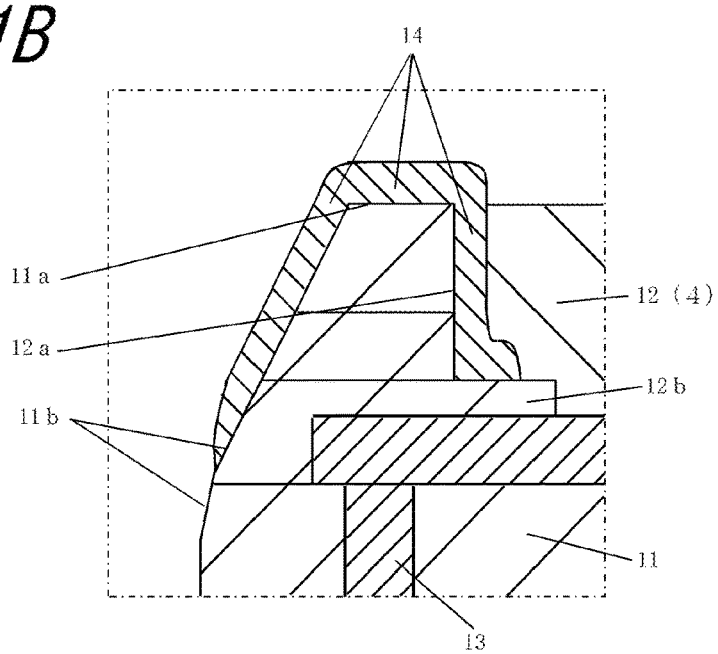
FIG. 11B is an enlarged longitudinal-sectional view of part B in FIG. 11A.

As in the example of FIG. 8A, the main surface 11a of the insulating base 11 may have an uncovered portion 11c (portion without the metal layer 14) that is not covered by the metal layer 14. The uncovered portion 11c may be used for checking the orientation of the light-emitting device.

The light-emitter mounting package 1 according to the second embodiment of the present invention is also effectively usable as a light-emitter mounting package 1 for a light-emitting device including a short-wavelength light emitter 2, such as a light-emitting device included in a UV light-emitting device, in the same manner as described for the light-emitter mounting package 1 according to the first embodiment.

Third Embodiment

A light-emitting device according to a third embodiment of the present invention will now be described with reference to FIGS. 10A to 11B.

The light-emitting device according to the third embodiment of the present invention differs from the light-emitting devices according to the above embodiments in that the recess 12 is circular as viewed from above and the inner wall 12a of the recess 12 has, on its inner surface, an inward protrusion 12b (extending toward the light emitter 2) adjacent to the bottom surface of the recess 12 as shown in FIGS. 10A to 11B.

The light-emitter mounting package according to the present embodiment includes the metal layer 14 that effectively reduces light passing through the wall of the recess 12 and leaking outside, in the same manner as in the light-emitter mounting package 1 according to the first embodiment, The protrusion 12b has a height equal to or greater than the thickness of the metal layer 14 arranged on the inner wall 12a of the recess 12. The protrusion 12b has a thickness of about 0.05 to 0.2 mm from the bottom surface of the recess 12, and protrudes inwardly by about 0.05 to 3 mm from the inner wall 12a of the recess 12. The protrusion 12b is a part of the insulating base 11. The protrusion 12b can be formed by punching the intended shape in the ceramic green sheets when the through-hole corresponding to the recess 12 is formed in the ceramic green sheets.

When the inner wall 12a of the recess 12 has the inward protrusion 12b (extending toward the light emitter 2) adjacent to the bottom surface, the wiring conductors 13 on the peripheral portion of the recess 12 adjacent to the inner wall 12a of the recess 12 can be spaced from the metal layer 14 on the inner wall 12a in a reliable manner. As in the example of FIGS. 10A to 11B, when the metal layer 14 extends from the inner wall 12a of the recess 12 to the surface of the protrusion 12b, that is, when the metal layer 14 extends over the protrusion 12b, the adhesion between the insulating base 11 and the metal layer 14 increases. The resultant light-emitter mounting package 1 can have high reliability. The surface of the protrusion 12b may be smoother (with less surface irregularity) than the inner wall 12a of the recess 12 to further increase the adhesion between the insulating base 11 and the metal layer 14.

As in the light-emitter mounting package 1 according to the first embodiment, the light-emitter mounting package 1 according to the third embodiment of the present invention is effectively usable as a light-emitter mounting package 1 for a light-emitting device including a short-wavelength light emitter 2, such as a light-emitting device included in a UV light-emitting device.

The present invention is not limited to the above embodiments and may be modified in various forms. For example, the second end of each wiring conductor 13, which extends to the lower surface of the insulating base 11, may extend to any of the side surfaces of the insulating base 11. For example, the side surface of the insulating base 11 may have a hole with its inner surface covered by a conductor, which specifically forms a castellation conductor. In this structure, the metal layer 14 on each sloping surface 11b is spaced from the castellation conductor arranged on the side surface of the insulating base 11.

In the above embodiments, the inner wall 12a of the recess 12 extends perpendicular to the bottom surface as viewed in longitudinal section. However, the inner wall 12a of the recess 12 may be inclined as viewed in longitudinal section to allow its opening side to be wider than its bottom surface side. As described in the third embodiment, the surface of the protrusion 12b may be smoother (with less surface irregularity) than the inner wall 12a of the recess 12, and the metal layer 14 may extend from the inner wall 12a of the recess 12 to the surface of the protrusion 12b.

The light-emitter mounting package 1 may include a substantially rectangular insulating base 11 having chamfered portions or arc-shaped cut portions at its corners. The metal layer 14 may cover the surfaces of the chambered or cut portions.

The main surface 11a of the insulating base 11 may have multiple recesses 12, and the metal layer 14 may be provided on the inner wall 12a of each recess 12.

In the above embodiments, the surface on which the light emitter 2 is mounted is at the same level as the wiring conductors 13. However, the light-emitter mounting surface and the wiring conductors 13 may be located at different levels. For example, the wiring conductors 13 may be formed on the protrusion 12b.

The first to third embodiments may each include components described in other embodiments.

REFERENCE SIGNS LIST 1 light-emitter mounting package
11 insulating base
11a main surface
11b sloping surface
11c uncovered portion
12 recess
12a inner wall
13 wiring conductor
14 metal layer
15 light-emitter mounting layer
16 central terminal layer
111 insulating mother substrate
111b groove
112 area to be insulating base
2 light emitter
3 connection member
4 encapsulant

The invention claimed is:

1. A light-emitter mounting package, comprising:
an insulating base having a main surface including a recess in which a light emitter is mountable, and a side surface including a sloping surface adjacent to the main surface;
a wiring conductor arranged on a peripheral portion of a bottom surface of the recess, the peripheral portion being adjacent to an inner wall of the recess;
a metal layer being spaced from the wiring conductor and extending on the inner wall of the recess, the main surface, and the sloping surface; and
a thickness of the metal layer on the inner wall of the recess and a thickness of the metal layer on the main surface being greater than a thickness of the metal layer on the sloping surface.

2. The light-emitter mounting package according to claim 1, wherein
a distance between an end of the metal layer on the side surface and the main surface is greater than a distance between an end of the metal layer on the inner wall and the main surface.

3. The light-emitter mounting package according to claim 1, wherein
a distance between an end of the metal layer on the side surface and the main surface is greater than a depth of the recess.

4. The light-emitter mounting package according to claim 1, wherein
the sloping surface curves in a convex as viewed in longitudinal section.

5. The light-emitter mounting package according to claim 1, wherein
the sloping surface includes a first sloping surface and a second sloping surface having different inclination angles.

6. The light-emitter mounting package according to claim 5, wherein
the insulating base includes a second main surface opposite to the main surface,
the first sloping surface is adjacent to the second main surface, and the second sloping surface is adjacent to the main surface, and
the second sloping surface has a greater inclination angle than the first sloping surface.

7. The light-emitter mounting package according to claim 1, wherein
the recess has an inward protrusion on a portion of the inner wall adjacent to the bottom surface.

8. The light-emitter mounting package according to claim 7, wherein
the metal layer extends over the protrusion.

9. A light-emitting device, comprising:
the light emitter mounting package according to claim 1; and
the light emitter mounted in the recess of the light-emitter mounting package.

10. A light-emitting module, comprising:
the light-emitting device according to claim 9; and
a module substrate including a connection pad to which the light-emitting device is connected with a bonding member.

* * * * *